United States Patent
Thilly et al.

(10) Patent No.: US 9,390,839 B2
(45) Date of Patent: Jul. 12, 2016

(54) COMPOSITE CONDUCTIVE CABLE COMPRISING NANOTUBES AND NANOFIBERS, COAXIAL MICROSTRUCTURE INCLUDING A COPPER MATRIX AND SAID NANOTUBES AND NANOFIBERS, AND METHOD FOR MANUFACTURING SAID MICROSTRUCTURE

(75) Inventors: Ludovic Thilly, Poitiers (FR); Florence Lecouturier, Balma (FR); Jean-Baptiste Dubois, Poitiers (FR); Nelson Ferreira, Cintegabelle (FR); Pierre-Olivier Renault, Poitiers (FR); Patrick Olier, Chatillon (FR)

(73) Assignees: Centre National De La Recherche Scientifique, Paris (FR); Universite De Poitiers, Poitiers (FR)

( * ) Notice: Subject to any disclaimer, the term of this patent is extended or adjusted under 35 U.S.C. 154(b) by 241 days.

(21) Appl. No.: 13/993,657
(22) PCT Filed: Dec. 9, 2011
(86) PCT No.: PCT/EP2011/072345
§ 371 (c)(1), (2), (4) Date: Aug. 27, 2013
(87) PCT Pub. No.: WO2012/080133
PCT Pub. Date: Jun. 21, 2012

(65) Prior Publication Data
US 2013/0319723 A1 Dec. 5, 2013

(30) Foreign Application Priority Data
Dec. 13, 2010 (FR) ..................................... 10 60409

(51) Int. Cl.
H01B 5/00 (2006.01)
H01B 11/18 (2006.01)
(Continued)

(52) U.S. Cl.
CPC ............ H01B 11/1895 (2013.01); H01B 1/026 (2013.01); H01B 13/016 (2013.01);
(Continued)

(58) Field of Classification Search
USPC ..................... 174/102 R, 126.1, 126.2, 126.3
See application file for complete search history.

(56) References Cited

U.S. PATENT DOCUMENTS

| | | | | |
|---|---|---|---|---|
| 3,983,521 A | * | 9/1976 | Furuto et al. | 335/216 |
| 2008/0146451 A1 | * | 6/2008 | Chen et al. | 505/231 |
| 2008/0274901 A1 | * | 11/2008 | Glowacki et al. | 505/230 |

FOREIGN PATENT DOCUMENTS

| | | | | |
|---|---|---|---|---|
| EP | 0346124 | * | 6/1989 | H01L 39/14 |
| EP | 0346124 A2 | | 12/1989 | |
| EP | 0731473 A2 | | 9/1996 | |

OTHER PUBLICATIONS

Thilly L et al, "Recent Progress in the Development of Ultra High Strength Continuous CU/NB and CU/TA Conductors for Non-Destructive Pulsed Fields Higher Than 80 T", Mar. 1, 2003.*
(Continued)

Primary Examiner — William H Mayo, III
(74) Attorney, Agent, or Firm — Baker & Hostetler LLP

(57) ABSTRACT

A conductive composite wire includes at least one external jacket made of copper, a first tube including a first metallic material ($M_1$) contacting and located inside the copper jacket; a second tube including a second metallic material ($M_2$) contacting and located inside the first tube; and a fiber including a third metallic material ($M_3$) contacting and located inside the second tube. The copper and the first metallic material are immiscible with each other, the first and second metallic materials are immiscible with each other, and the second and third metallic materials are immiscible with each other. A copper-based coaxial microstructure includes a copper sheath containing an array of nanotubes and nanofibers according to a process for manufacturing the microstructure.

12 Claims, 2 Drawing Sheets

(51) Int. Cl.
  *H01B 1/02* (2006.01)
  *H01L 39/24* (2006.01)
  *H01B 13/016* (2006.01)
  *H01F 6/06* (2006.01)

(52) U.S. Cl.
  CPC ........ *H01L39/2403* (2013.01); *H01L 39/2406* (2013.01); *H01F 6/06* (2013.01); *Y10T 29/49123* (2015.01); *Y10T 428/12382* (2015.01); *Y10T 428/12819* (2015.01); *Y10T 428/12903* (2015.01)

(56) References Cited

OTHER PUBLICATIONS

Sandim et al. "Superconductivity and Magnetic Properties of Multifiamentary Cu—Nb Micro/ Nanocomposite Wires", 2008 Nova Science Publishers, Inc., pp. 109-158.

Vidal et al. "Elaboration by Severe Plastic Deformation, Microstructural and Mechanical Study of Cu/X (X=Ta or Nb) Nanofilamentary Wires for Use in High Field Magnet", Materials Science Forum vols. 503-504, Jan. 2006, pp. 639-644.

Spencer et al. "Established and Emerging Materials for Use as High-Field Magnet Conductors", Advanced Engineering Materials vol. 6, No. 5, 2004, pp. 290-297.

Billette et al. "Identification of Aging Mechanisms for Non-Destructive Pulsed Magnets Operating in the 60 T Range", IEEE Transactions on Applied Superconductivity, vol. 14, No. 2, Jun. 2004, pp. 1237-1240.

Thilly et al. "Recent Progress in the Development of Ultra High Strength "Continuous" Cu/Nb amd Cu/Ta Conductors for Non-Destructive Pulsed Fields Higher Than 80 T", IEEE Transactions on Applied Superconductivity, vol. 12, No. 1, Mar. 2002, pp. 1181-1184.

Sandim et al. "Size Effects on the Magnetic Properties of Cu—Nb Nanofilamentary Wires Processed by Severe Plastic Deformation", Superconductor Science and Technology, vol. 19, 2006, pp. 1233-1239.

L. Thilly, et al., "Recent Progress in the Development of Ultra High Strength "Continuous" Cu/Nb and Cu/Ta Conductors for Non-Destructive Pulsed Fields Higher than 80 T", IEEE Transactions on Applied Superconductivity, Mar. 1, 2002, pp. 1181-1184, vol. 12, No. 1, IEEE Service Center, Los Alamitos, CA, USA, XP011069256.

L Thilly, et al., "Size-Induced Enhanced Mechanically Properties of Nanocomposite Copper/Niobium Wires: Nanoindentation Study", Acta Materialia, Dec. 3, 2002, pp. 5049-5065, vol. 50, No. 20, XP055007073.

* cited by examiner

COMPOSITE CONDUCTIVE CABLE COMPRISING NANOTUBES AND NANOFIBERS, COAXIAL MICROSTRUCTURE INCLUDING A COPPER MATRIX AND SAID NANOTUBES AND NANOFIBERS, AND METHOD FOR MANUFACTURING SAID MICROSTRUCTURE

CROSS-REFERENCE TO RELATED APPLICATIONS

This application is a National Stage of International patent application No. PCT/EP2011/072345, filed on Dec. 9, 2011, which claims priority to foreign French patent application No. FR 1060409, filed on Dec. 13, 2010, the disclosures of which are incorporated by reference in their entirety.

FIELD OF THE INVENTION

The field of the invention is that of nanocomposite conductors and notably that of nanocomposite wires intended for the manufacture of cables for the manufacture of nondestructive resistive coils.

BACKGROUND

Generally, the generation of pulsed magnetic fields requires nondestructive resistive coils to be manufactured; to do this, materials having both excellent mechanical and electrical properties are required in order to allow the high current that creates the magnetic field to be transported and to allow the coil to withstand the forces of magnetic origin (Lorentz forces) that tend to break the coil. At the present time, the best candidates for coils generating fields higher than 70 teslas (T) are nanocomposite materials consisting of niobium (Nb) nanostructures inserted in a pure copper (Cu) matrix.

Studies have already been carried out in the field of the development of reinforced (macro and nanocomposite) conductors for high-field coils as notably described in the following articles: "Interface instability in the drawing process of copper/tantalum conductors", L. Thilly, J. Colin, F. Lecouturier, J. P. Peyrade, J. Grilhé, S. Askénazy, Acta Material A, 47-3 (1999), 853; "Recent progress in the development of ultra high strength "continuous" Cu/Nb and Cu/Ta conductors for non-destructive pulsed fields higher than 80 T", L. Thilly, F. Lecouturier, G. Coffe, S. Askenazy, IEEE Transactions on Applied Superconductivity, 12-1 (2002), 1181; "A review of established and emerging materials for use as high-field magnet conductors", K. Spencer, F. Lecouturier, L. Thilly, J. D. Embury, Advanced engineering Materials, 6-5 (2004), 290-297; and "Identification of aging mechanisms for non destructive pulsed magnets operating in the 60 T range", J. Billette, F. Lecouturier, O. Portugall, IEEE Transactions on Applied Superconductivity (2004), Vol. 14, No. 2, 1237-1240.

However, the nanocomposite conductors based on copper matrices and niobium nanotubes currently studied and/or manufactured suffer from the presence of internal defects that cause breaks and prevent long nanostructured composite wires, indispensable for the manufacture of magnets, from being obtained.

SUMMARY OF THE INVENTION

Thus the present invention relates to novel conductive composite wires having an additional level of nanomaterials interlaced with one another comprising nanotube and nanowire structures. These novel conductive wires allow, on the one hand, defect-free materials that are long enough to envision coiling them in order to manufacture pulsed magnets to be obtained, and on the other hand, excellent mechanical and electrical properties, meeting the specifications required for very high pulsed magnetic field coils (fields typically higher than 70 T), to be obtained.

Therefore, these novel conductive composite wires may advantageously be used in applications such as pulsed resistive electromagnets in the 60 to 100 T range and superconducting electromagnets operating continuously in the 10 to 25 T range.

Thus, one subject of the invention is a conductive composite wire comprising at least one external jacket made of copper, characterized in that it furthermore comprises:
  a first tube consisting of a first metallic material making contact with and located inside said copper jacket;
  a second tube consisting of a second metallic material and making contact with and located inside said first tube; and
  a fiber consisting of a third metallic material and making contact with and located inside said second tube,
  the copper and the first material being immiscible with each other, the first and second materials being immiscible with each other, the second and third materials being immiscible with each other.

The advantage obtained, over the prior art, by introducing an additional level of material into the composite wire of the present invention notably lies in the improvement, due to the size effect, in the mechanical performance of the composite wire thus obtained, and in the fact that a nanostructure can be obtained more rapidly.

According to one variant of the invention, the first material and the third material are both niobium, and the second material is copper.

According to one variant of the invention, the radial dimensions of the tubes and of the fibers are submicron-size.

According to one variant of the invention, the external jacket has a hexagonal geometry.

Another subject of the invention is a copper-based coaxial microstructure characterized in that it comprises a copper sheath containing an array of elementary segments corresponding to conductive composite wires according to the invention.

According to one variant of the invention, the outside diameter of the sheath being about one millimeter, said sheath contains thousands or millions of conductive composite elementary segments of submicron-size dimensions.

Yet another subject of the invention is a process for manufacturing a coaxial microstructure according to the invention, characterized in that it comprises the following steps:
  producing a cylindrical initial billet comprising a copper sheath having an initial diameter $\phi$ and containing a first tube consisting of a first metallic material making contact with and located inside said copper sheath, a second tube consisting of a second metallic material making contact with and located inside said first tube, and a third tube consisting of a third metallic material making contact with and located inside said second tube, the copper and the first material being immiscible with each other, the first and second materials being immiscible with each other, the second and third materials being immiscible with each other, this coaxial structure forming an elementary segment;

a series of i elementary steps leading to the formation of an ith billet from an (i−1)th billet where 1≤i≤N, and comprising:

reducing the diameter of an (i−1)th billet by a factor R so as to obtain a billet of diameter $\phi/R$;

shaping said (i−1)th billet into a hexagonal geometry;

cutting said (i−1)th billet of hexagonal geometry into M elements; and inserting the M sections into a copper sheath in order to form an ith billet, the parameters M and R being of the same order of magnitude and the Nth billet comprising elementary segments of nanoscale dimensions.

According to one variant of the invention, the diameter reducing step comprises the following operations:

heat treating the billet for a hot extrusion operation;

extruding said heated billet; and drawing said billet.

According to one variant of the invention, the first material and the third material both being niobium, the second material being copper, the heat treatment is carried out at a temperature of about 700° C.

According to one variant of the invention, the process comprises steps of degassing said billets before the heat treatment operations for the extrusion.

According to one variant of the invention, the process comprises a first series of billet manufacturing steps comprising a degassing step at a temperature of about 200° C. followed by a second series of billet manufacturing steps comprising a degassing step at a higher temperature of about 400° C.

According to one variant of the invention, the number M is equal to 85.

According to one variant of the invention, the number N is about 4.

It will be noted that, according to the process of invention, the greater the desired improvement in the mechanical properties of the coaxial microstructures, the more the number N is increased.

Moreover, it will also be noted that it is possible to adjust various parameters in order to achieve the dimensions desired for the microstructure; either the degree of diameter reduction during a given drawing operation is favored, or the operations described above are increased in number, thereby densifying said microstructure of elementary segments.

BRIEF DESCRIPTION OF THE DRAWINGS

The invention will be better understood and other advantages will become apparent on reading the following nonlimiting description and by virtue of the appended figures, in which.

DETAILED DESCRIPTION

Figure 1:
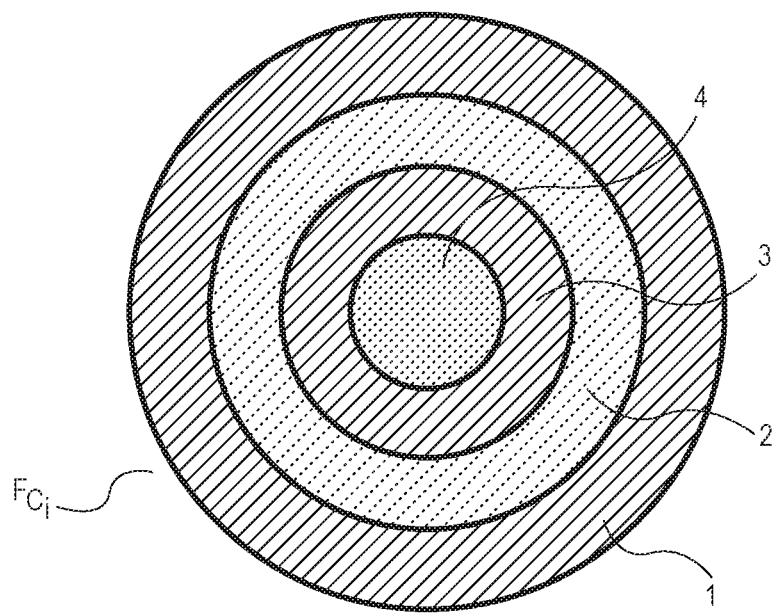
FIG. 1 illustrates an example elementary segment according to the invention.

Generally, an elementary segment $F_{ci}$ according to the invention comprises, as illustrated in FIG. 1:

an external copper jacket 1;

a first tube 2 made of a material that is immiscible with copper and that may advantageously be niobium;

a second tube 3 made of a material that is immiscible with niobium and that may, in this case, advantageously also be copper; and a filament 4 made of a material that is immiscible with copper and that may therefore also advantageously be niobium.

Depending on the applications targeted, this elementary segment may typically have a radial dimension of about a few tens of nanometers in size and an entirely satisfactory mechanical performance when present in a large number in a copper matrix.

Figure 2:
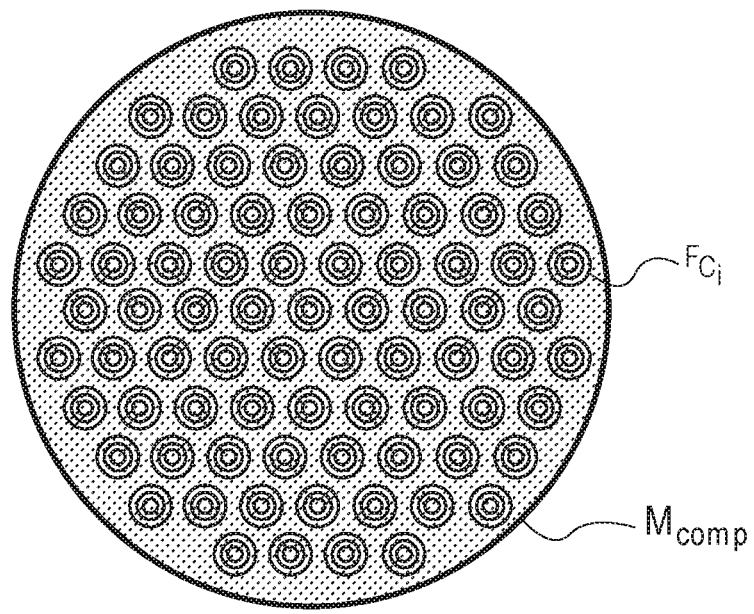
FIG. 2 illustrates a copper-based coaxial microstructure according to the invention comprising a copper sheath containing an array of 85 elementary segments according to the invention.

It is possible to envision forming a coaxial microstructure from an array of elementary segments. Thus, the microstructure of the invention, $M_{comp}$, comprises an array of elementary composite segments $F_{ci}$ in a copper sheath, as illustrated in FIG. 2. Typically, the copper sheath may be about a few tens of microns in diameter. Thus, the present invention allows a microstructure that is reinforced mechanically by the presence of three nanoscale phases to be obtained, and allows the geometry of the distribution of the reinforcement to be controlled while preserving the initial geometry during the manufacturing process, as explained below, thereby simplifying the manufacturing process.

An example of a process for manufacturing such a microstructure, comprising process steps optimized in order to reinforce the mechanical and conductive properties of said coaxial microstructure, will now be described in detail.

The Applicant(s) notably make use of certain steps, already described in the literature with respect to optimization of the cold drawing conditions of CuNb and co-cylinder CuNbCu nanowire systems, and more precisely with respect to the development and optimization of the "accumulative drawing and bundling" (ADB) process, in order to limit the appearance of defects, making it possible to achieve nanoscale dimensions and to improve extrusion conditions by applying the same optimization as for the drawing, i.e. by modifying the angle of the dies and also the temperature. In this respect, reference may notably be made to the following articles: "Optimisation des propriétés mécaniques des conducteurs nanofilamentaires Cu/X avec X=Nb ou Ta, par l'étude des mécanismes élémentaires de déformation", V. Vidal, PhD thesis INSAT No. 855, 11 Dec. 2006; "Elaboration by severe plastic deformation, microstructural and mechanical study of Cu/X with X=Nb or Ta, nanofilamentary wires for the use in high field magnets", V. Vidal, L. Thilly, F. Lecouturier, Materials Science Forum, 503-504 (2006), 639-644.

Regarding the hot extrusion steps, reference may also be made to the following articles: "Size effects on the magnetic properties of Cu—Nb nanofilamentary wires processed by severe plastic deformation", M. J. R. Sandim, D. Stamopoulos, H. R. Z. Sansim, L. Ghivelder, L. Thilly, V. Vidal, F. Lecouturier, D. Raabe, Superconducting Science and Technology 19 (2006) 1233-1239; "Magnetism and Superconductivity in low dimensional systems: Utilisation in Future Applications", published by NOVA Science, New York (www.novapublishers.com), edited by Dismosthenis Stamopoulos (Inst. of Materials Science, Athens, Greece), 2008; "Superconductivity and magnetic properties of multifilamentary Cu—Nb micro/nano composite wires", M. Sandim, H. R. Z. Sandim, L. Ghivelder, L. Thilly, F. Lecouturier, D. Stamopoulos.

Figure 3:
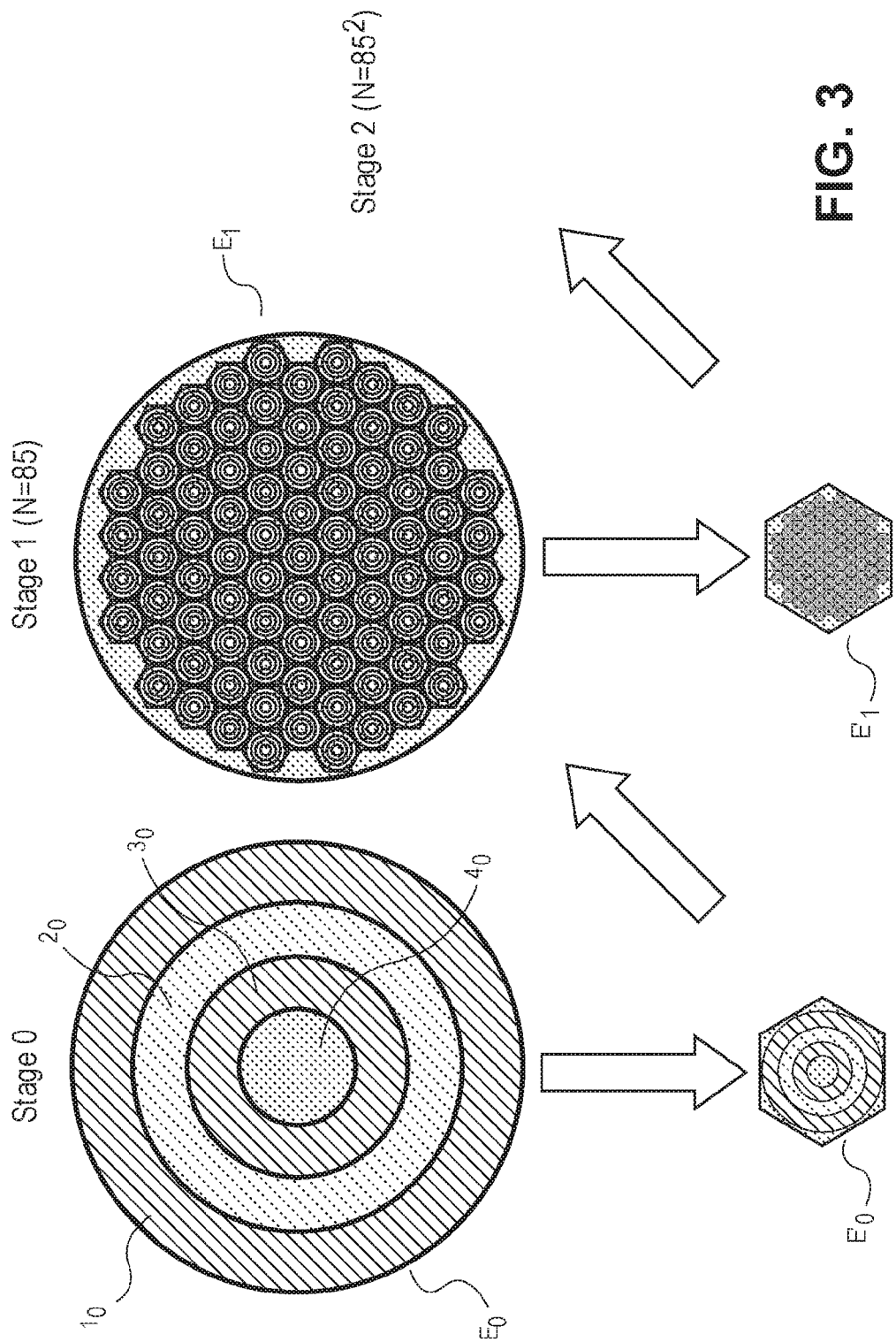
FIG. 3 illustrates a few steps of a process for manufacturing a microstructure according to the invention.

The following are all of the main steps (called Stages):

Stage 0:

A bar $4_0$ of Nb, corresponding to the third material, of diameter $\phi_3$=10 mm is inserted into a copper tube $3_0$, corresponding to the second material, of outside diameter $\phi_{2e}$=25 mm and of inside diameter $\phi_{2i}$=10 mm, itself inserted in a tube $2_0$ of Nb, corresponding to the first material, of outside diameter $\phi_{3e}$=35 mm and of 25 mm inside diameter, as shown in FIG. 3.

This assembly is placed in a copper sheath $1_0$ of outside diameter $\phi_{eG}$=44 mm and of inside diameter $\phi_{iG}$=35 mm, the ends of which are covered and sealed with copper caps. What is called the initial billet $E_0$ is thus obtained.

The initial billet is then degassed for two hours at a temperature of 200° C.

The billet $E_0$ is subjected to a heat treatment for two hours at 700° C. before it is hot extruded with a cross section reduction ratio of 8.6.

After extrusion, the billet $E_0$ is drawn at room temperature under optimized conditions (with optimized die angles and degree of reduction per pass) through dies of cylindrical geometry until a diameter of 4.51 mm is obtained.

The Applicant has, by trial and error, obtained an optimum value for degree of reduction of 20% or less and a optimum value for die angle of less than 20°, thereby allowing both internal defects and problems with co-deformation to be simultaneously reduced. The drawn bar obtained from the billet $E_0$ is then drawn and simultaneously shaped through hexagonal dies until a billet $E'_0$ having a hexagonal outside shape of 3.70 mm in height is obtained, this billet $E'_0$ allowing the subsequent arrangement of said conductive composite wires in a copper sheath to be optimized.

The hexagonal bar is cut into 85 rods that are straightened (specifically, since the segments obtained are sometimes curved, they are advantageously straightened).

The caps are removed from the 85 rods.

Stage 1:

The 85 hexagonal rods obtained from the billet $E'_0$ are stacked and placed in a copper sheath having the same outside and inside diameters as those of the billet $E_0$ ($\phi_{eG}$=44 mm and $\phi_{iG}$=35 mm) in order to form a billet $E_1$.

The billet $E_1$ is then subjected to the same heat treatment as the billet $E_0$. FIG. 3 illustrates the billet reduction, the multiplication of said reduced billets and their integration into a new copper sheath.

Stage 2:

The 85 hexagonal rods obtained from the billet $E'_1$ are stacked and placed in a copper sheath having the same outside and inside diameters as those of the billet $E_0$ ($\phi_{eG}$=44 mm and $\phi_{iG}$=35 mm) in order to form a billet $E_2$.

The billet $E_2$ is then subjected to the same treatment as the billet $E_1$.

Stage 3:

The 85 hexagonal rods obtained from the billet $E_2$ are stacked and placed in a copper sheath having the same outside and inside diameters as those of the billet $E_0$ ($\phi_{eG}$=44 mm and $\phi_{iG}$=35 mm) in order to form a billet $E_3$.

The billet $E_3$ is then degassed in an optimal way, at a temperature of 400° C. for two hours. The Applicant(s) has (have) observed that at this level of dimension reduction and at this degree of densification of the elements, the degassing operations must be carried out at higher temperatures than the degassing operations carried out in the preceding steps.

The billet $E_3$ is then subjected to a heat treatment for two hours at 700° C. before it is hot extruded with a cross section reduction ratio of 8.6.

After extrusion, the billet $E_3$ is drawn at room temperature under optimized conditions (with optimized die angles and degree of reduction per pass) through dies of cylindrical geometry until a diameter of 3.85 mm is obtained.

A first alternative stage (Stage 4) may then optionally be carried out.

The drawn bar obtained from the billet $E_3$ is then drawn and simultaneously shaped through hexagonal dies until a new billet $E_4$ having a hexagonal outside shape of 3.35 mm in height is obtained.

The hexagonal bar is cut into 85 rods that are straightened. The caps are removed from the 85 rods.

According to a second alternative for obtaining reinforced conductors in Stage 3.

The billet $E_3$ of diameter of 3.85 mm is drawn to diameters smaller than 0.8 mm without break.

A reinforced conductor having a diameter of 2.064 mm is formed from Nb nanofibers having a theoretical diameter of 322 m and from Nb nanotubes having a theoretical thickness of 161 nm. Its electrical resistivity is 2.277 µohm·cm (i.e. 75.7% IACS—reference value for pure copper according to the IACS standard) at room temperature and 0.496 µohm·cm at 77 K. Its tensile strength is higher than 873 MPa at 77 K.

A reinforced conductor having a diameter of 0.875 mm is formed from Nb nanofibers having a theoretical diameter of 136 nm and from Nb nanotubes having a theoretical thickness of 68 nm. Its electrical resistivity is 2.335 µohm·cm (i.e. 73.8% IACS) at room temperature and 0.561 µohm·cm at 77 K. Its tensile strength is higher than 1087 MPa at 77 K.

Depending on the mechanical properties ultimately required, the process may be extended by a Stage 4 in order to further optimize the properties of the microstructure obtained.

Optional Stage 4:

The 85 hexagonal rods obtained from the first alternative are stacked and placed in a copper sheath having the same outside and inside diameters as those of the preceding sheaths ($\phi_{eG}$=44 mm and $\phi_{iG}$=35 mm) in order to form a billet $E_4$.

At this point, the thickness of the copper sheath is increased in order to prevent any risk of said sheath cracking during the drawing phase.

The billet $E_4$ is subjected to the same treatment steps as those described above for the billet $E_3$ and the process continues according to alternative 2: the billet $E_4$ is degassed in an optimal way at a temperature of 400° C. for two hours. The billet $E_4$ is then subjected to a heat treatment for two hours at 700° C. before it is hot extruded with a cross section ratio of 8.6.

After extrusion, the billet $E_4$ is drawn at room temperature under optimized conditions (with optimized die angles and degree of reduction per pass) in dies of cylindrical geometry until a diameter corresponding to the targeted properties is obtained.

Thus, the coaxial microstructures of the invention may be used to produce coils for pulsed magnets, the nanostructure of the copper/niobium composite allowing the elastic limit of the conductor to be raised above 1 GPa thereby allowing it to withstand the very high stresses created by the Lorentz forces in the coil, while the good electrical conductivity of the copper is preserved for the transport of current.

The invention claimed is:

1. A conductive composite wire, comprising:
at least one external jacket made of copper,
a first tube consisting of a first metallic material contacting and located inside said at least one external jacket;
a second tube consisting of a second metallic material contacting and located inside said first tube; and
a fiber consisting of a third metallic material contacting and located inside said second tube,
the copper and the first metallic material being immiscible with each other, the first and second metallic materials being immiscible with each other, and the second and third metallic materials being immiscible with each other, wherein radial dimensions of the tubes and of the fibers are submicron-sized.

2. The conductive composite wire of claim 1, wherein the first metallic material and the third metallic material are both niobium, and the second metallic material is copper.

3. The conductive composite wire of claim 1, wherein the at least one external jacket has a hexagonal geometry.

4. A copper-based coaxial microstructure comprising a copper sheath including an array of elementary segments corresponding to the conductive composite wires of claim 1.

5. The coaxial microstructure of claim 4, wherein, when the outside diameter of the sheath is about one millimeter, said copper sheath comprises thousands or millions of elementary segments of submicron-sized dimensions.

6. A process for manufacturing the coaxial microstructure of claim 4, the process comprising:
   producing a cylindrical initial billet ($E_0$) comprising a copper sheath having a reference diameter ($\Phi_R$) and comprising:
      a first tube consisting of a first metallic material ($M_1$) contacting and located inside said copper sheath,
      a second tube consisting of a second metallic material ($M_2$) contacting and located inside said first tube, and
      a third tube consisting of a third metallic material ($M_3$) contacting and located inside said second tube, the copper and the first metallic material being immiscible with each other, the first and second metallic materials being immiscible with each other, and the second and third metallic materials being immiscible with each other;
   a series of i elementary steps leading to the formation of an ith billet from an (i−1)th billet where $1 \leq i \leq N$, and comprising:
      reducing the diameter of an (i−1)th billet by a factor R to obtain a billet of diameter $\phi/R$;
      shaping said (i−1)th billet into a hexagonal geometry;
      cutting said (i−1)th billet of hexagonal geometry into M elements; and
      inserting the M sections into a copper sheath in order to form an ith billet ($E_i$).

7. The process for manufacturing the coaxial microstructure of claim 6, wherein reducing the diameter comprises:
   heat treating the billet for a hot extrusion operation;
   extruding said heated billet; and
   drawing said billet.

8. The process for manufacturing the coaxial microstructure of claim 7, wherein, when the first metallic material and the third metallic material are both niobium and the second metallic material is copper, the heat treating is carried out at about 700° C.

9. The process for manufacturing the coaxial microstructure of claim 7, further comprising degassing said billets before heat treating for the hot extrusion operations.

10. The process for manufacturing the coaxial microstructure of claim 9, further comprising degassing at a temperature of about 200° C. and degassing at a higher temperature of about 400° C.

11. The process for manufacturing the coaxial microstructure of claim 6, wherein the number M is equal to 85.

12. The process for manufacturing the coaxial microstructure of claim 6, wherein the number N is about 4.

\* \* \* \* \*